United States Patent
Park et al.

(10) Patent No.: US 7,340,498 B2
(45) Date of Patent: Mar. 4, 2008

(54) APPARATUS AND METHOD FOR DETERMINING FIXED POINT IN MOBILE COMMUNICATION SYSTEM

(75) Inventors: Tan Joong Park, Anyang (KR); Sung Lark Kwon, Seoul (KR); Hee Gul Park, Kimpo (KR)

(73) Assignee: LG Electronics Inc., Seoul (KR)

( * ) Notice: Subject to any disclaimer, the term of this patent is extended or adjusted under 35 U.S.C. 154(b) by 1168 days.

(21) Appl. No.: 10/446,108

(22) Filed: May 28, 2003

(65) Prior Publication Data
US 2004/0047436 A1 Mar. 11, 2004

(30) Foreign Application Priority Data
Sep. 7, 2002 (KR) ............... 10-2002-0054052

(51) Int. Cl.
*G06F 7/499* (2006.01)
(52) U.S. Cl. .................................... 708/551
(58) Field of Classification Search ................ 708/551
See application file for complete search history.

(56) References Cited

U.S. PATENT DOCUMENTS

| | | | | |
|---|---|---|---|---|
| 4,511,922 A | * | 4/1985 | Lewis, Jr. ................... | 348/720 |
| 6,195,672 B1 | * | 2/2001 | Gouger et al. ............. | 708/204 |
| 6,237,084 B1 | * | 5/2001 | Morikawa et al. .......... | 712/221 |
| 6,360,204 B1 | * | 3/2002 | Li et al. ..................... | 704/500 |
| RE39,121 E | * | 6/2006 | Morikawa et al. .......... | 712/221 |

* cited by examiner

*Primary Examiner*—D. H. Malzahn
(74) *Attorney, Agent, or Firm*—Birch, Stewart, Kolasch & Birch, LLP

(57) ABSTRACT

Apparatus and method for determining a fixed point in a mobile communication system are disclosed. An initial fixed point is set through simulation and a saturation for an output of a target device is compared with a reference saturation. Then, the position of the initial fixed point is adaptively changed according to the change in the output range of the target device. Therefore, when a floating point is converted into a fixed point, the performance of the system can be improved while the complexity of the hardware can be reduced.

24 Claims, 6 Drawing Sheets

(0 BIT TRUNCATION) DESPREADER OUTPUT (1 BIT TRUNCATION) DESPREADER OUTPUT

APPARATUS AND METHOD FOR DETERMINING FIXED POINT IN MOBILE COMMUNICATION SYSTEM

The present application claims, under 35 U.S.C. § 119, the priority benefit of patent application Ser. No. 54052/2002 filed Sep. 7, 2002, the entire contents of which are herein fully incorporated by reference.

BACKGROUND OF THE INVENTION

1. Field of the Invention

The present invention relates to a mobile communication system and, more particularly, to an apparatus and method for determining a fixed point in a mobile communication system that are capable of adaptively changing a fixed point according to an output range of a target device when a floating point is converted into a fixed point.

2. Description of the Background Art

In general, when a device is designed, a system designer must check the performance of the device and/or whether the device is operable by using simulation after applying an operation algorithm. If the performance of the device does not extend to the desired level, the operation algorithm should be corrected or a parameter adopted to the corresponding algorithm should be changed to find an optimum value that will provide the desired performance.

Simulation is executed by a tool or a program language. A primary object of the simulation lies in an algorithm comparison and a performance checking. In these stages, the simulation is performed without limiting the number of bits, which is called a floating point simulation.

However, in a stage where the device is actually implemented, the number of bits is limited because there is a limitation to the size of the hardware. But, the limitation to the number of bits leads to the degradation of device performance. That is, the number of bits and the performance have a tradeoff relation to each other.

Therefore, when the process moves from the simulation stage to the device implementation stage, a suitable fixed point is needed in consideration of the size of the hardware and the degree of performance degradation. The fixed point is determined through a fixed point simulation at the simulation stage. The fixed point determination involves determining the number of saturation bits and the number of truncation bits.

Once a suitable fixed point is determined through the above-discussed operation, a hardware is designed by using the determined fixed point at the device implementation stage, thereby completing the desired device.

In designing a system, the system designer first performs a floating point simulation for a digital data and then performs a fixed point simulation to convert the floating point into a fixed point. At this time, the system designer performs the simulation such that the number of bits and the position of the saturation and truncation bits are determined in an optimum state while changing the number of bits and the saturation point, thereby determining a fixed point.

The position of the fixed point, that is, the optimum number of bits and the position of the saturation and truncation bits, varies depending on an output range of a target device.

For example, an output of a despreader in a third generation partnership project (3GPP) downlink varies depending on a spreading factor (SF) and the number of orthogonal channels. Accordingly, in case of implementing a fixed point hardware for the output of the despreader, the number of bits and the position of the saturation bit and the truncation bit are changed.

In a limited fixed point hardware, many bits are required to cover all the output range of the despreader. In this respect, however, if the number of bits of the fixed point is continuously increased, the hardware size is increased and becomes complicated.

In addition, as mentioned above, the optimum number of bits and the position of saturation bit and truncation bit vary depending on the range of an output signal of the target device. Thus, the determination of the fixed point in this situation inevitably causes the degradation of performance of an overall system.

SUMMARY OF THE INVENTION

Therefore, an object of the present invention is to provide an apparatus and method for determining a fixed point of a mobile communication system that are capable of adaptively determining a fixed point according to an output range of a target device.

To achieve at least the above objects in whole or in parts, there is provided a method for determining a fixed point of a mobile communication system including the steps of: measuring a saturation rate of an input bit; and comparing the measured saturation rate and a reference saturation rate and changing a truncation position of the input bit.

To achieve at least these advantages in whole or in parts, there is further provided a method for determining a fixed point of a mobile communication system including the steps of: setting a fixed point through simulation; measuring an optimum saturation rate for an output bit of a target device through simulation; storing the measured saturation rate as a reference saturation rate; measuring an actual saturation rate for an output bit of a target device; comparing the measured saturation rate and a reference saturation rate and generating a control command; and changing a truncation position of an output bit of the target device according to the control command.

To achieve at least these advantages in whole or in parts, there is further provided an apparatus for determining a fixed point of a mobile communication system including: a saturation rate detector for detecting a saturation rate of an input bit; a truncation position controller for comparing the detected saturation rate and a reference saturation rate and generating a control command; and a bit truncation unit for adaptively changing a truncation position of the input bit according to the control command outputted from the truncation position controller.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

Figure 1:
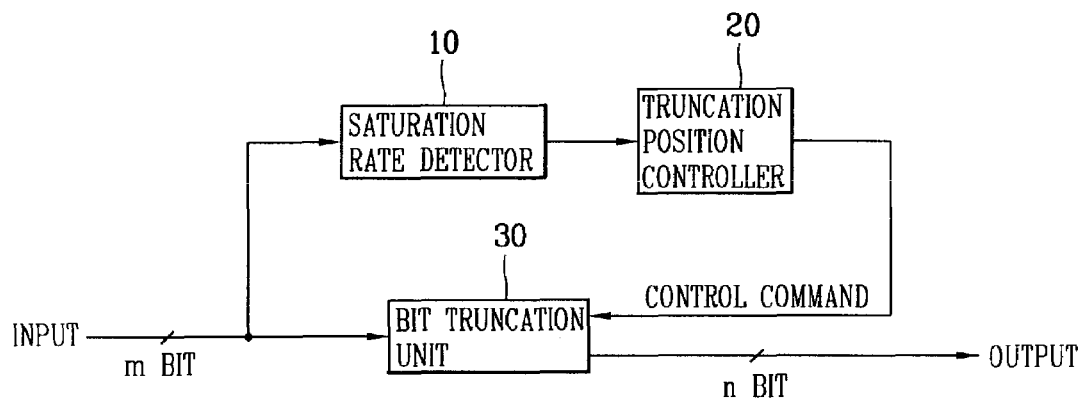
FIG. 1 is a block diagram of an apparatus for determining a fixed point of a mobile communication system in accordance with a preferred embodiment of the present invention.

FIG. 1 is a block diagram of an apparatus for adaptively determining a fixed point of a mobile communication system in accordance with an embodiment of the present invention.

As shown in FIG. 1, an adaptive fixed point determining apparatus in accordance with the present invention includes a saturation rate detector 10 for detecting a saturation rate of an 'm' bit input signal; a truncation position controller 20 for comparing the detected saturation rate with a reference saturation rate and generating a control command based on the comparison results; and a bit truncation unit 30 for truncating the input bits according to the control command and thereby generating an 'n' bit output signal. All these elements are operatively coupled.

Figure 2:
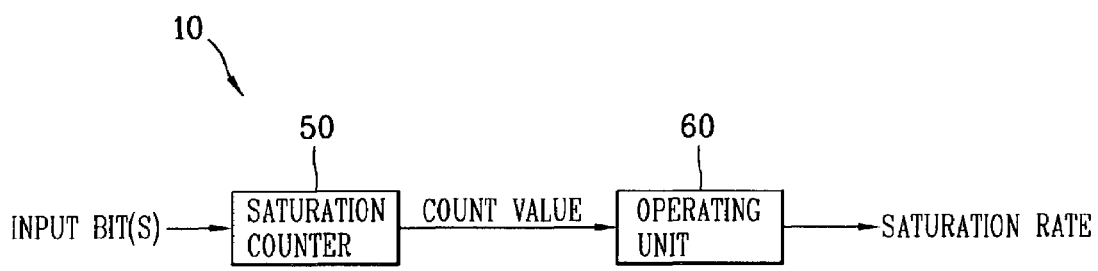
FIG. 2 illustrates a detailed construction of a saturation rate detector of FIG. 1 according to an embodiment of the present invention.

With reference to FIG. 2, the saturation rate detector 10 includes a saturation counter 50 for counting the saturation number of input bits, and an operating unit 60 for determining the saturation rate of the input bits using a count value output from the saturation counter 50 and thereby outputting the saturation rate of the input bits. All these elements are operatively coupled.

Figure 3:
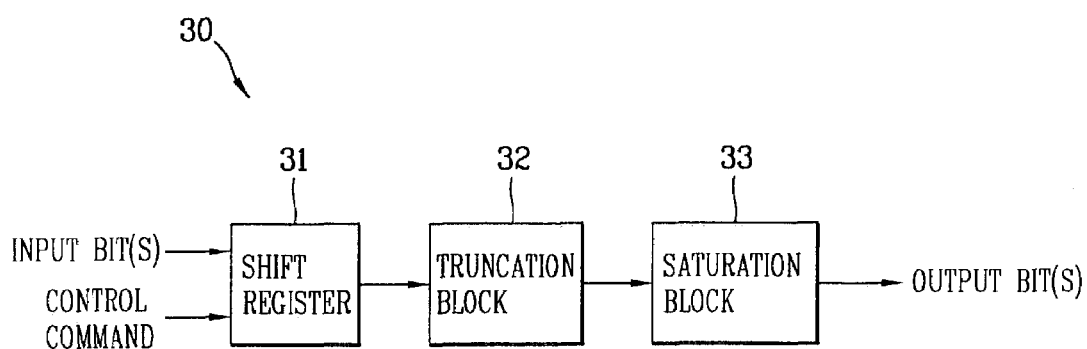
FIG. 3 illustrates a detailed construction of a bit truncation unit of FIG. 1 according to an embodiment of the present invention.
Figure 4A:
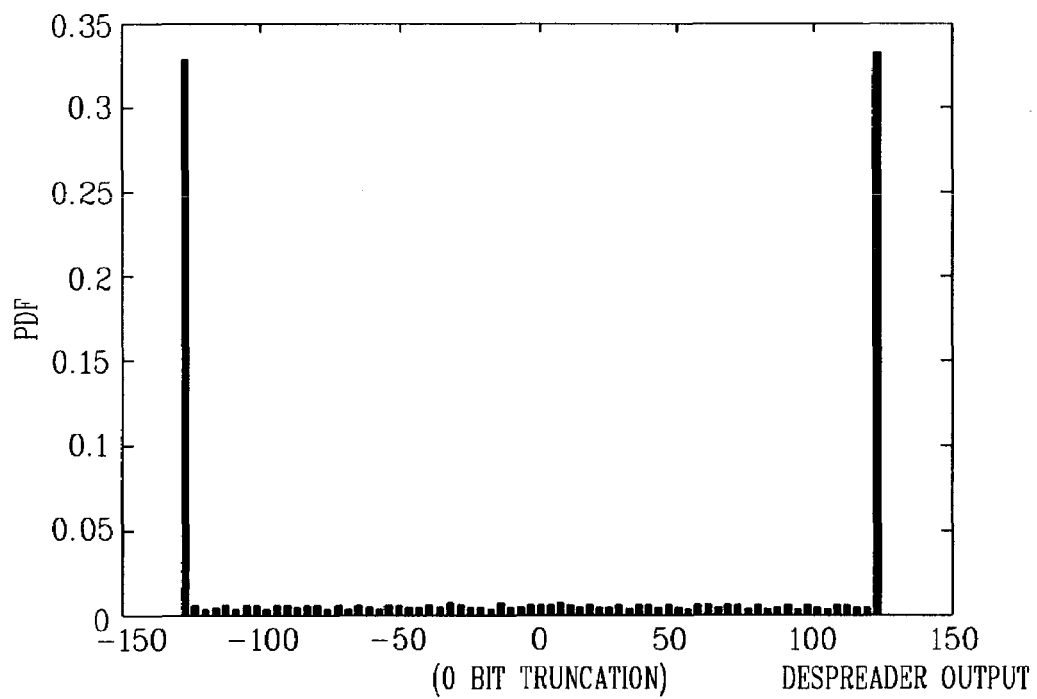
FIGS. 4A through 4E are examples of graphs showing a probability distribution function with respect to an output of a despreader in a fading channel when SF=128 and Eb/No=3dB is used in a 3GPP downlink system.
Figure 4B:
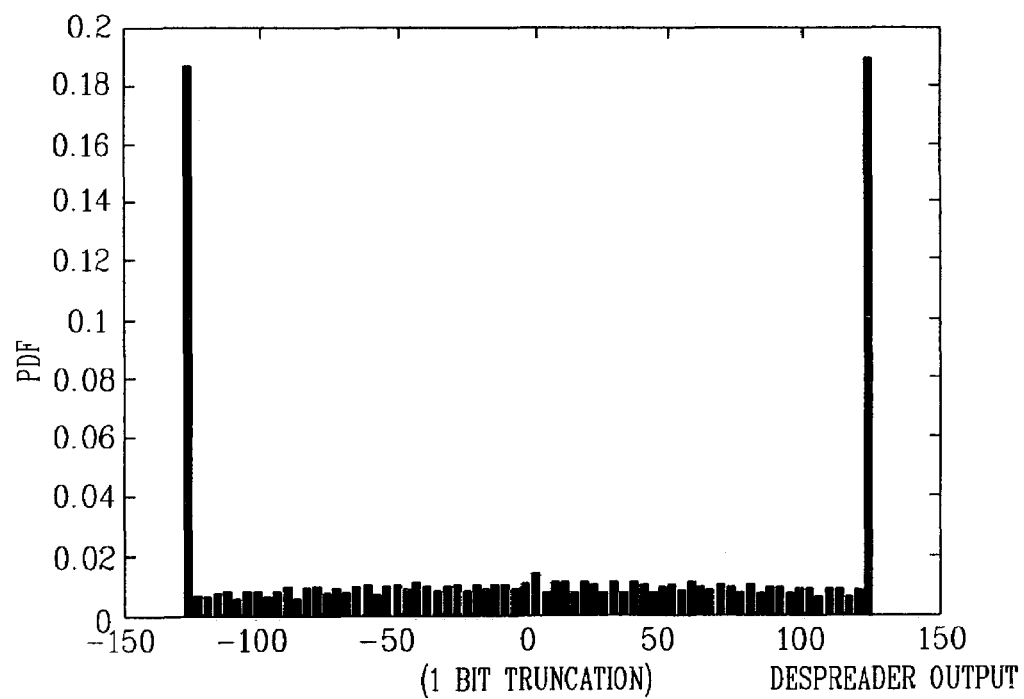
Figure 4C:
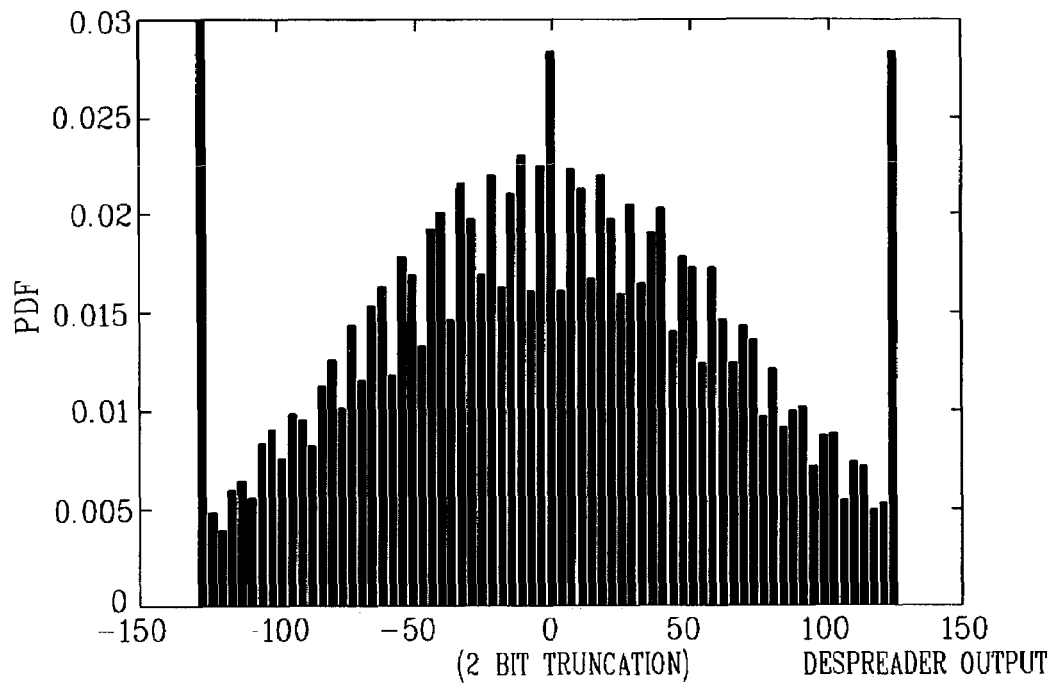
Figure 4D:
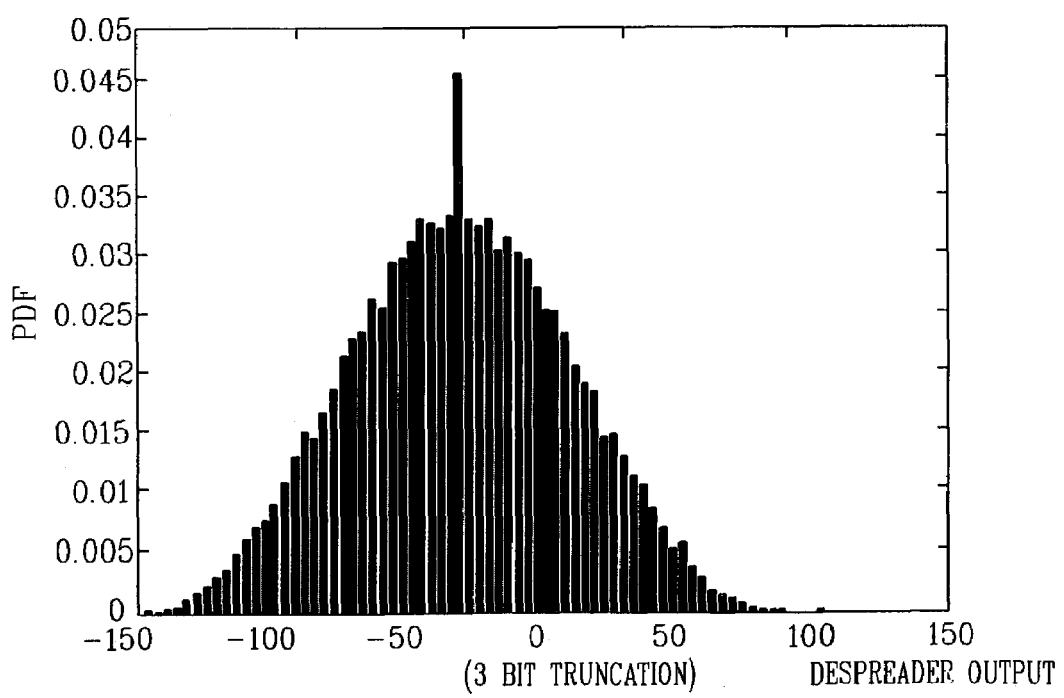
Figure 4E:
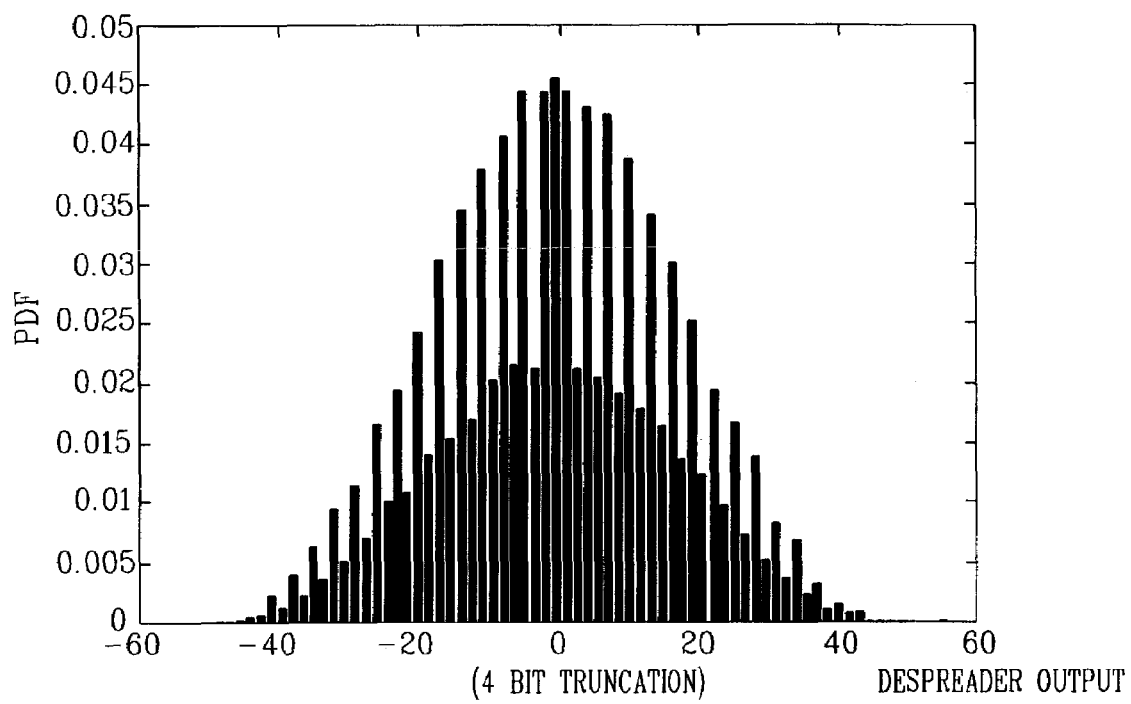

With reference to FIG. 3, the bit truncation unit 30 includes a shift register 31 for shifting the 'm' bit input signal according to the control command output from the truncation position controller 20, a truncation block 32 for truncating a truncation bit from the input bits shifted in the shift register 31, and a saturation block 33 for truncating a saturation bit from the output bits of the truncation block 32 and thereby outputting the 'n' bit output signal. All these elements are operatively coupled.

The operation of the fixed point determining apparatus as described above will now be described with reference to FIGS. 1 through 7.

Figure 7:
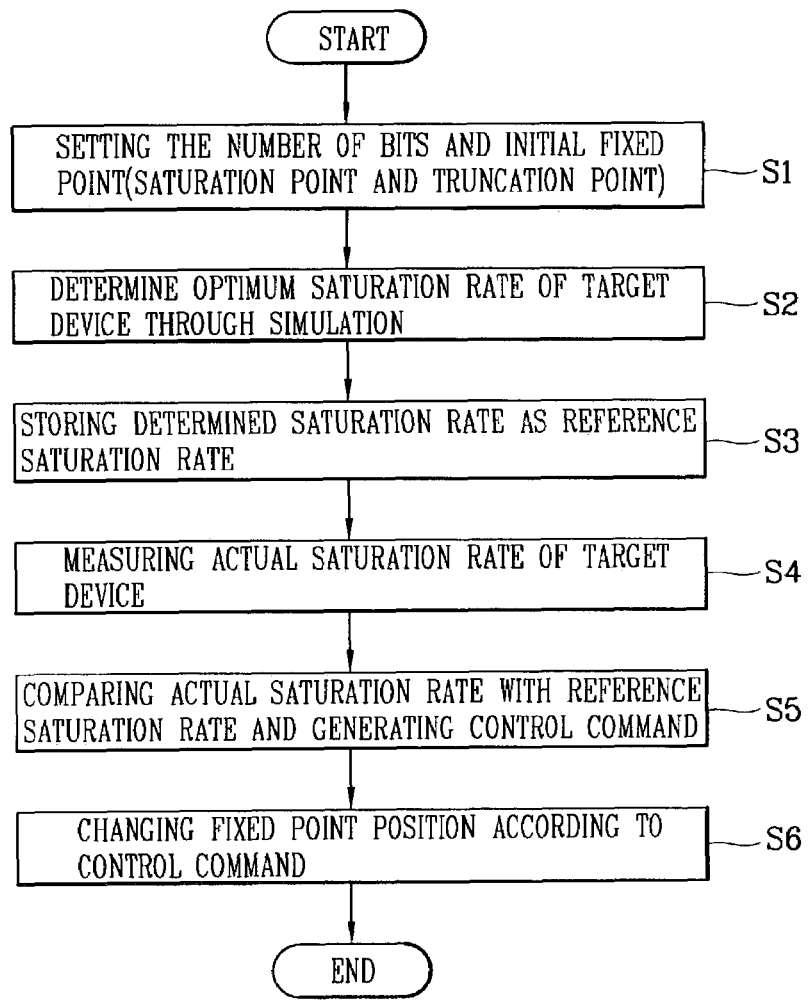
FIG. 7 is a flow chart depicting a process of adaptively changing a position of a fixed point according to a change in the output range of the despreader in FIG. 1 according to an embodiment of the present invention.

First, as shown in FIG. 7, in order to convert a floating pint to a fixed point, the number of bits and an initial fixed point (saturation point and truncation point) are set for an output bit of a target device (step S1).

Since an optimum fixed point varies depending on the range of an input signal (i.e., an output signal of the target device), the optimum fixed point can be determined based on an output of the target device from the currently selected fixed point. That is, the optimum fixed point is determined according to whether the output of the target device is uniformly distributed in the currently used range.

In this manner, after the initial fixed point is set, the optimum saturation rate of the output signal of the target device is determined using simulation (step S2), and used as a reference to determine the optimum fixed point. At this time, the optimum saturation rate of the target device may vary depending on the characteristics of the target device and applied target. The optimum saturation rate is used to show an optimum performance or in what range the performance degradation becomes severe.

Here, a despreader (target device) of a rake receiver in the 3GPP downlink system is taken as an example to explain the process of setting an optimum value (reference value) of the saturation rate.

In general, an output of the despreader has a trade-off between a phase according to a saturation and size distortion and a phase according to a quantization distortion based on truncation. Thus, an optimum value should be found between two distortions at a limited fixed point.

Figure 5:
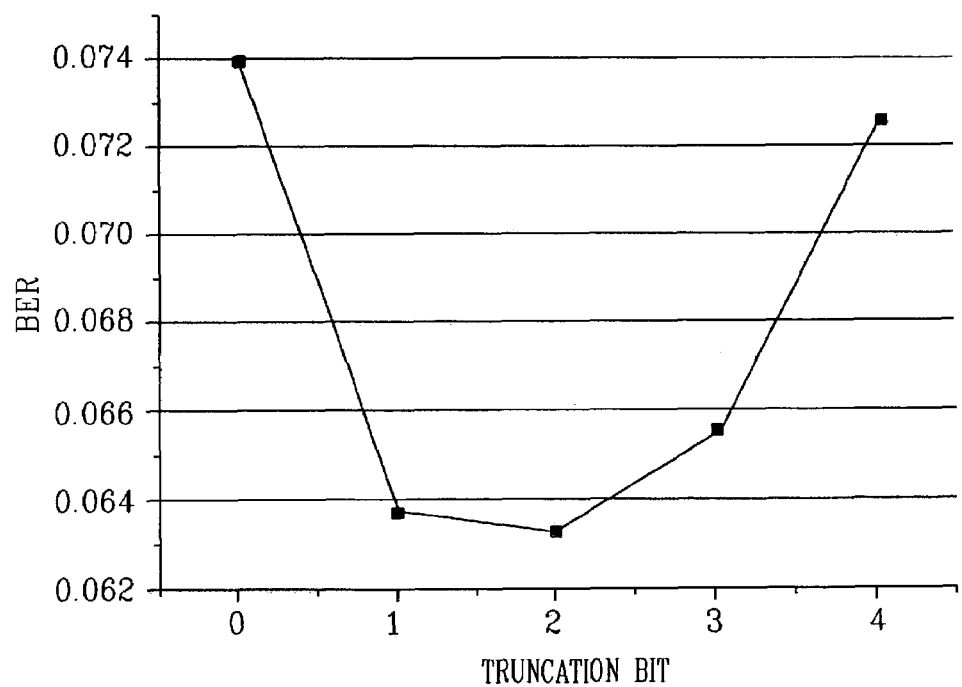
FIG. 5 is an example of a graph showing a bit error rate (BER) with respect to the output of the despreader of FIGS. 4A through 4E.

FIGS. 4A through 4E are examples of graphs showing a probability distribution function (PDF) for an output of the despreader in a fading channel when SF=128 and Eb/No=3dB in a 3GPP downlink system. Each drawing shows values by increasing the truncation bit 1 bit by 1 bit and reducing the saturation bit 1 bit by 1 bit in a state that an output bit of the despreader is fixed. At this time, when a bit error rate (BER) is detected for the output of the despreader according to 1 bit windowing, the best BER is obtained when 2 bits are truncated as shown in FIG. 5.

Accordingly, as mentioned above, according to the result of measuring the PDF and the BER for the output of the despreader according to the bit windowing, when the saturation occurred by more than 20%, a sharp performance degradation appears, while in the case that the saturation was below 3%, the performance degradation was severe even though it had a rather gentle distribution while the quantization noise is increased.

That is, in this example the optimum fixed point exists between the point where there occurs 20% saturation and a point where there occurs 3% saturation, and the performance change was not steep. Therefore, maintaining the saturation rate for the output of the despreader between two threshold values (20% and 3%) is needed for the performance of a terminal. However, if needed, other values for the saturation may be used.

In the present invention, the two threshold values (20%, 3%) obtained by simulation at step S2 are used as parameters for determining a truncation position of the input bit (i.e., an output bit of the target device). At this time, one threshold value (3%) is used to move the truncation position upwardly while the other threshold value (20%) is used to move the truncation position downwardly.

The two threshold values, that is, the saturation threshold value (20%) and the truncation threshold value (3%) are stored in the truncation position controller 20 as first and second reference saturation rates, respectively (step S3).

In general, if the input bit of the despreader is 'n' bit, an expressible output range of the despreader is $-2^n \leq$ output range $\leq 2^n - 1$. If there occurs a value going beyond this range, the despreader cannot express the corresponding value but can express it by $-2^n$ or $2^n - 1$, which is called saturation.

The saturation rate detector 10 measures the actual saturation rate for the digital output signal of the despreader (step S4). As shown in FIG. 2, the saturation counter 50 counts $-2^n$ or $2^n-1$ included in the 'm' bit digital output signal outputted from the despreader to count the saturation number. The operating unit 60 receives this count value from the saturation counter 50 and calculates a saturation rate (%) based on the count value by the following equation:

Saturation rate (%)=(count value/$T$)*100% wherein 'T' is a count period.

The truncation position controller 20 compares the measured saturation rate outputted from the saturation rate detector 10 with the first and second reference saturation rates stored therein, and outputs a control command based on the comparison results (step S5). That is, when the measured saturation rate exceeds the first reference saturation rate (20%), the truncation position controller 20 outputs a down control command. If, however, the measured saturation rate is less than the second reference saturation rate (3%), the truncation position controller 20 outputs an up control command. At this time, the output period of the control command is the same as the counter period (T) of the saturation counter 50.

Figure 6:
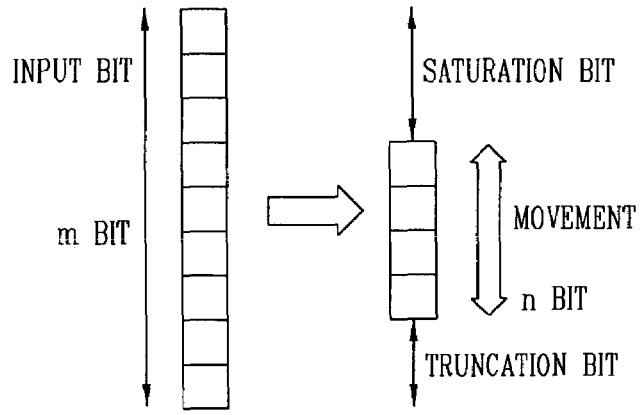
FIG. 6 illustrates a bit truncation operation in accordance with an embodiment of the present invention.

As shown in FIG. 6, the bit truncation unit 30 changes a bit truncation position for the output signal of the despreader according to the control command (up/down command) outputted from the truncation position controller 20 and thereby determines an optimum fixed point (step S6). For this purpose, the shift register 31 as shown in FIG. 3 shifts its input bits according to the control command. For example, if the shift register 31 receives the down command, the shift register 31 shifts the input bits by 1 bit leftwardly. If the shift register 31 receives the up command, the shift register 31 shifts the input bits by 1 bit rightwardly. Then, the truncation block 32 and the saturation block 33 truncate the truncation bit and the saturation bit from the shifted input bits, respectively, to thereby change the 'm' bit input signal to an 'n' bit output signal.

For instance, when the down command is inputted, the bit truncation unit 30 reduces the saturation bit by 1 bit and increases the truncation bit by 1 bit. Meanwhile, when the up command is inputted, the bit truncation unit 30 increases the saturation bit by 1 bit and reduces the truncation by 1 bit.

A more detailed discussion on the operation of FIG. 7 will now be described with reference to FIG. 8.

The saturation rate of the digital output signal of a target device (e.g., a despreader) which is changed according to an external environment, is measured by using the saturation rate detector 10 (step S10). That is, the saturation rate for the input bit signal (i.e., output signal of the target device) is measured.

After the saturation rate of the target device is measured, the truncation position controller 20 compares the measured saturation rate with the stored reference saturation rates (step S11) to check whether the measured saturation rate is between the first and second reference saturation rates (step S12). In this example, the first reference saturation rate is greater than the second reference saturation rate. Upon checking, if the measured saturation rate falls between the first and second reference saturation rates, the process is terminated and the pre-set truncation position of the input bit measured signal is maintained.

Meanwhile, if the measured saturation rate does not fall between the first and second reference saturation rates, the truncation position controller 20 checks whether the measured saturation rate is greater than the first reference saturation rate (step S13).

If the measured saturation rate is greater than the first reference saturation rate, the truncation position controller 20 generates a down control command (step S14). If, however, the measured saturation rate is not greater than the first reference saturation rate, the truncation position controller 20 checks whether the measured saturation rate is smaller than the second reference saturation rate (S15).

Upon checking, if the measured saturation rate is smaller than the second reference saturation rate, the truncation position controller 20 generates an up control command (step S16). That is, if the measured saturation rate goes beyond the range between the first and second reference saturation rates, the truncation position controller 20 generates a control command (up/down command) to change the truncation position of the input bits.

Figure 8:
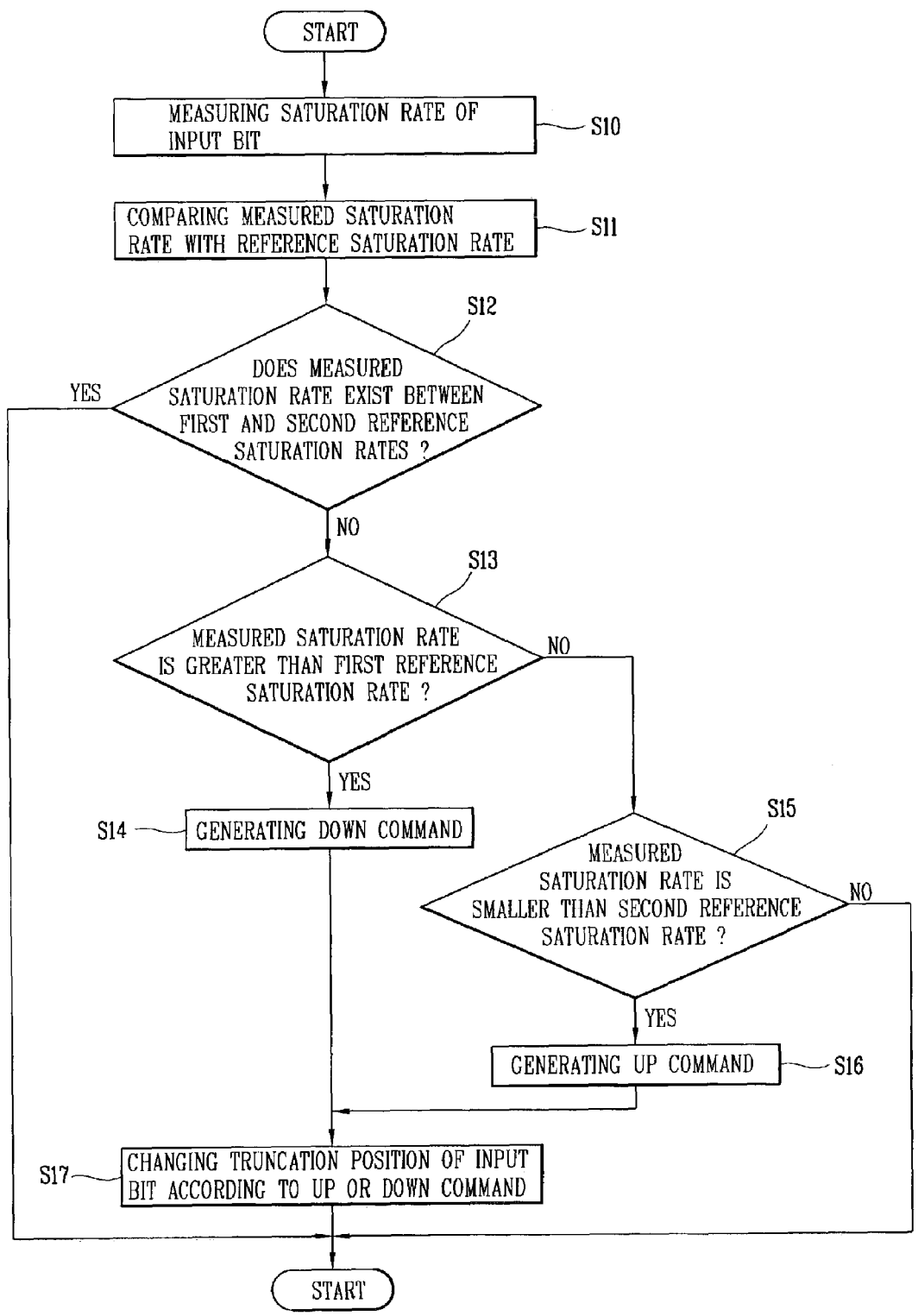
FIG. 8 is a detailed flow chart depicting a process of changing a position of a fixed point according to a change in the output range of the despreader in FIG. 7 according to an embodiment of the present invention.

Although the method discussed in FIGS. 7 and 8 are implementable by the device as shown in FIGS. 1-3, the present method can be implemented using other suitable devices which are considered equivalent structures.

Accordingly, the bit truncation unit 30 shifts the input bits, that is, the truncation position of the output bits of the despreader, according to the down or up command outputted from the truncation position controller 20, thereby determining an optimum fixed point (step S17).

In the present invention, the output of the despreader was taken as an example for explanation's sake only, but any device or system can be adoptable without being limited thereto, so long as its range of an output signal is variable and wide.

As so far described, the apparatus and method for determining a fixed point in a mobile communication system have an advantage that since an optimum fixed point is selected by varying a bit truncation position of an input signal depending on a change of the input signal, when a floating point is converted into a fixed point, the performance of the system can be improved significantly and the complexity of hardware can be reduced greatly.

The foregoing embodiments and advantages are merely exemplary and are not to be construed as limiting the present invention. The present teaching can be readily applied to other types of apparatuses, systems, environments, etc. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. A method for determining a fixed point of a communication system, the method comprising:
   determining a saturation rate of input bits; and
   changing a truncation position of the input bits by comparing the determined saturation rate with reference saturation rate information.

2. The method of claim 1, further comprising:
   setting an initial truncation position of the input bits; and
   storing the reference saturation rate information.

3. The method of claim 1, wherein the reference saturation rate information includes first and second reference saturation rates which, respectively, indicate a saturation threshold value and a truncation threshold value.

4. The method of claim 1, wherein, in the determining step, the saturation rate of the input bits is calculated by the following formula:

Saturation rate (%)=(saturation number of the input bits/T)*100%, wherein 'T' is a count period.

5. The method of claim 1, wherein the truncation position changing step comprises:
checking whether the determined saturation rate falls between first and second reference saturation rates of the reference saturation rate information;
generating a control command to change the truncation position of the input bits if the determined saturation rate does not fall between the first and second reference saturation rates; and
changing the truncation position of the input bits according to the control command.

6. The method of claim 5, wherein the control command generating step comprises:
checking whether the determined saturation rate is greater than the first reference saturation rate;
generating a down command if the determined saturation rate is greater than the first reference saturation rate;
checking whether the determined saturation rate is smaller than the second reference saturation rate if the determined saturation rate is not greater than the first reference saturation rate; and
generating an up command if the determined saturation rate is smaller than the second reference saturation rate.

7. The method of claim 5, wherein the truncation position changing step comprises:
shifting the input bits according to the control command; and
truncating a truncation bit and a saturation bit from the shifted input bits.

8. The method of claim 6, wherein when the down command is received, the input bits are shifted by 1 bit leftwardly, while when the up command is received, the input bits are shifted by 1 bit rightwardly.

9. The method of claim 6, wherein the truncation position changing step comprises:
reducing a saturation bit of the input bits by 1 bit and increasing a truncation bit of the input bits by 1 bit when the down command is received;
increasing the saturation bit of the input bits by 1 bit and reducing the truncation bit of the input bits by 1 bit when the up command is received.

10. The method of claim 1, wherein, in the determining step, the input bits are output bits of a target device.

11. A method for determining a fixed point in a communication system, the method comprising:
setting an initial fixed point;
storing reference saturation rate information;
determining an actual saturation rate with respect to output bits of a target device at the initial fixed point;
generating a control command by comparing the determined saturation rate with the reference saturation rate information; and
adaptively changing a position of the initial fixed point according to the control command.

12. The method of claim 11, wherein in the saturation rate determining step, the actual saturation rate is calculated by the following formula:

Saturation rate (%)=(saturation count value of the output bits/T)*100%, wherein 'T' is a count period.

13. The method of claim 11, wherein, in the control command generating step, if the determined saturation rate is greater than a first reference saturation rate of the reference saturation rate information, a down command is generated, while if the determined saturation rate is not greater than the first reference saturation rate and is smaller than a second reference saturation rate of the reference saturation rate information, an up command is generated.

14. The method of claim 13, wherein the fixed point position changing step comprises:
reducing a saturation bit by 1 and increasing a truncation bit by 1 bit if the down command is received; and
increasing the saturation bit by 1 bit and reducing the truncation bit by 1 bit if the up command is received.

15. An apparatus for determining a fixed point of a communication system, the apparatus comprising:
a saturation rate detector for detecting a saturation rate of input bits;
a truncation position controller for comparing the detected saturation rate with reference saturation rate information and generating a control command based on the comparison results; and
a bit truncation unit for adaptively changing a truncation position of the input bits according to the control command outputted from the truncation position controller.

16. The apparatus of claim 15, wherein the saturation rate detector comprises:
a saturation counter for counting a saturation number of the input bits; and
an operating unit for calculating the saturation rate of the input bits using the count value from the saturation counter.

17. The apparatus of claim 16, wherein the operating unit calculates the saturation rate by the following formula:

Saturation rate (%)=(saturation count value/T)* 100%, wherein 'T' is a count period.

18. The apparatus of claim 15, wherein the truncation position controller generates the control command if the detected saturation rate does not fall between first and second reference saturation rates of the reference saturation rate information, where the truncation position controller outputs a down command if the detected saturation rate is greater than the first reference saturation rate, and outputs an up command if the detected saturation rate is smaller than the second reference saturation rate, where the first reference saturation rate is greater than the second reference saturation rate.

19. The apparatus of claim 15, wherein the bit truncation unit comprises:
a shift register for shifting the input bits according to the control command;
a truncation block for truncating a truncation bit from the input bits shifted by the shift register; and
a saturation block for truncating a saturation bit from the input bits from which the truncation bit has been truncated.

20. The apparatus of claim 19, wherein if a down control command is inputted, the shift register shifts the input bits by 1 bit leftwardly, while if an up control command is inputted, the shift register shifts the input bits by 1 bit rightwardly.

21. The apparatus of claim 15, wherein if the control command is a down command, the bit truncation unit reduces a saturation bit by 1 bit and increases a truncation bit by 1 bit, while if the control command is an up command, the bit truncation unit increases the saturation bit by 1 bit and reduces the truncation bit by 1 bit.

22. A device for determining a fixed point of a communication system, the device comprising:
   means for determining a saturation rate of input bits; and
   means for changing a truncation position of the input bits based on a comparison of the determined saturation rate with at least one reference saturation rate.

23. The device of claim 22, wherein the determining means determines the saturation rate of the input bits by the following formula:

Saturation rate (%)=(saturation number of the input bits/T)*100%, wherein 'T' is a count period.

24. The device of claim 22, wherein the changing means shifts the input bits according to the changed truncation position; and the device further comprises:
   means for changing a truncation bit and a saturation bit from the shifted input bits.

* * * * *